US012658669B2

(12) United States Patent
Nakano

(10) Patent No.: US 12,658,669 B2
(45) Date of Patent: Jun. 16, 2026

(54) SEMICONDUCTOR LASER LIGHT SOURCE DEVICE

(71) Applicant: Mitsubishi Electric Corporation, Tokyo (JP)

(72) Inventor: Seiji Nakano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 554 days.

(21) Appl. No.: 18/259,984

(22) PCT Filed: Apr. 27, 2021

(86) PCT No.: PCT/JP2021/016796
§ 371 (c)(1),
(2) Date: Jun. 29, 2023

(87) PCT Pub. No.: WO2022/230053
PCT Pub. Date: Nov. 3, 2022

(65) Prior Publication Data
US 2024/0097399 A1 Mar. 21, 2024

(51) Int. Cl.
*H01S 5/02315* (2021.01)
*H01S 5/02212* (2021.01)
(Continued)

(52) U.S. Cl.
CPC ...... *H01S 5/02415* (2013.01); *H01S 5/02212* (2013.01); *H01S 5/02253* (2021.01);
(Continued)

(58) Field of Classification Search
None
See application file for complete search history.

(56) References Cited

U.S. PATENT DOCUMENTS 5,212,699 A 5/1993 Masuko et al.
6,791,150 B2 * 9/2004 Takagi ................ H01S 5/02415
257/85

(Continued)

FOREIGN PATENT DOCUMENTS

CN 113659425 A * 11/2021 ......... H01S 5/02415
JP H04-75394 A 3/1992
(Continued)

OTHER PUBLICATIONS

International Search Report issued in PCT/JP2021/016796; mailed Jul. 6, 2021.

*Primary Examiner* — Tod T Van Roy
(74) *Attorney, Agent, or Firm* — Studebaker Brackett PLLC

(57) ABSTRACT

The first and second lead pins (2*b*-2*d*) are arranged on the principal surface side of the dielectric substrate (6). The third lead pin (2*e*) is arranged on a back surface side of the dielectric substrate (6). The lower substrate (5*b*) has a protruding portion protruding above the upper substrate (5*c*). A metalized portion (5*d*) for supplying power to the thermoelectric devices (5*a*) is provided at the protruding portion. A temperature control module conductor (9) is provided from the principal surface to an upper side surface of the dielectric substrate (6). The fourth conductive wire (14*j*,14*k*) includes a conductive wire (14*k*) connecting the temperature control module conductor (9) provided on the upper side surface of the dielectric substrate (6) and the third lead pin (2*e*), and a conductive wire (14*j*) connecting the temperature control module conductor (9) provided on the principal surface of the dielectric substrate and the metalized portion (5*d*).

20 Claims, 8 Drawing Sheets

(51) Int. Cl.

| | |
|---|---|
| *H01S 5/02253* | (2021.01) |
| *H01S 5/0231* | (2021.01) |
| *H01S 5/02325* | (2021.01) |
| *H01S 5/0239* | (2021.01) |
| *H01S 5/024* | (2006.01) |
| *H01S 5/026* | (2006.01) |
| *H01S 5/062* | (2006.01) |

(52) U.S. Cl.

CPC ........ *H01S 5/0231* (2021.01); *H01S 5/02315* (2021.01); *H01S 5/02325* (2021.01); *H01S 5/0239* (2021.01); *H01S 5/0265* (2013.01); *H01S 5/06226* (2013.01)

(56) References Cited

U.S. PATENT DOCUMENTS

| | | | | |
|---|---|---|---|---|
| 7,037,001 | B2 * | 5/2006 | Oomori ............... | H01S 5/02212 |
| | | | | 372/31 |
| 7,171,066 | B1 | 1/2007 | Sakai et al. | |
| 7,217,958 | B2 * | 5/2007 | Aruga ................. | G02B 6/4292 |
| | | | | 385/100 |
| 7,663,228 | B2 * | 2/2010 | Tateiwa .............. | H01S 5/02212 |
| | | | | 257/E23.006 |
| 9,093,811 | B2 * | 7/2015 | Lee ..................... | H01S 5/02345 |
| 9,534,960 | B2 * | 1/2017 | Kim ................... | H01S 5/06804 |
| 2002/0012369 | A1 | 1/2002 | Nasu et al. | |
| 2012/0045161 | A1 | 2/2012 | Okada | |
| 2024/0097399 | A1 * | 3/2024 | Nakano .............. | H01S 5/02212 |
| 2025/0096524 | A1 * | 3/2025 | Fukushima .......... | H01S 5/0265 |
| 2025/0210932 | A1 * | 6/2025 | Fukushima ......... | H01S 5/02325 |

FOREIGN PATENT DOCUMENTS

| | | | | | |
|---|---|---|---|---|---|
| JP | 2002-043686 | A | | 2/2002 | |
| JP | 2007081261 | A | * | 3/2007 | |
| JP | 3998526 | B2 | * | 10/2007 | .......... G02B 6/4204 |
| JP | 2008-244384 | A | | 10/2008 | |
| JP | 2010-135688 | A | | 6/2010 | |
| JP | 2013-251424 | A | | 12/2013 | |
| JP | 2019-186380 | A | | 10/2019 | |
| JP | 2022143754 | A | * | 10/2022 | .......... H01S 5/0262 |
| WO | 2010/140473 | A1 | | 12/2010 | |
| WO | WO-2025094245 | A1 | * | 5/2025 | .......... H01S 5/0231 |
| WO | WO-2025134277 | A1 | * | 6/2025 | ............ H01S 5/024 |

* cited by examiner

SEMICONDUCTOR LASER LIGHT SOURCE DEVICE

FIELD

The present disclosure relates to a semiconductor laser light source device that controls a temperature of a semiconductor light modulation device with a temperature control module.

BACKGROUND

SNS, video-sharing service, and the like, have spread on a worldwide scale, accelerating increase in capacity of data transmission. To support signal transmission at higher speed and with larger capacity in a limited mounting space, increase in speed and reduction in size of an optical transceiver have been promoted. In addition to higher speed and lower cost, an optical device is required to achieve lower power consumption to reduce running cost.

As a structure of a laser light source device equipped with a semiconductor light modulation device, a transistor-outlined CAN (TO-CAN) type that can be brought to production at low cost is typically applied. In a structure of the TO-CAN, typically, lead pins are sealed and fixed to a metal stem using glass. A pressure by a difference in thermal expansion coefficients is utilized, and thus, arrangement of the lead pins and an interval between the lead pins are important to secure high airtightness.

An oscillation wavelength or light output changes by the semiconductor light modulation device generating heat. Thus, a temperature control module is used in the laser light source device equipped with the semiconductor light modulation device to keep a temperature of the semiconductor light modulation device constant (see, for example, PTL 1).

CITATION LIST

Patent Literature

[PTL 1] JP 2011-518381

SUMMARY

Technical Problem

In a structure in related art, a high-frequency line of a first dielectric substrate on which a semiconductor light modulation device is mounted is joined to a high-frequency line of a second dielectric substrate joined to lead pins, with a conductive wire. Presence of the second dielectric substrate increases cost and decreases a degree of freedom in mounting on the first dielectric substrate. Further, a distance from the lead pins to the semiconductor light modulation device becomes longer, which deteriorates high-frequency characteristics due to impedance mismatch or increase in inductance components. Still further, due to a long distance from the temperature control module to the semiconductor light modulation device and poor thermal diffusivity, power consumption increases. Further, an electrical signal is input to the semiconductor light modulation device using a single-layer drive scheme, and thus, power consumption increases.

The present disclosure has been made to solve the problems as described above, and an object of the present disclosure is to provide a semiconductor laser light source device capable of reducing cost and power consumption and improving a degree of freedom in mounting on a dielectric substrate and high-frequency characteristics.

Solution to Problem

A semiconductor laser light source device according to the present disclosure includes: a metal stem; first to third lead pins penetrating through the metal stem; a support block provided on the metal stem; a temperature control module mounted on a side surface of the support block and including a lower substrate, an upper substrate, and a plurality of thermoelectric devices put between the lower substrate and the upper substrate; a dielectric substrate having a back surface joined to the upper substrate of the temperature control module; two differential driving signal lines provided on a principal surface of the dielectric substrate; a semiconductor light modulation device mounted on the principal surface of the dielectric substrate; a temperature sensor mounted on the principal surface of the dielectric substrate; a first conductive wire connecting one end of the differential driving signal line and the semiconductor light modulation device; a second conductive wire connecting the other end of the differential driving signal line and the first lead pin; a third conductive wire connecting the temperature sensor and the second lead pin; and a fourth conductive wire connecting the temperature control module and the third lead pin.

Advantageous Effects of Invention

In the present disclosure, the temperature control module is mounted on the side surface of the support block provided on the metal stem, and the dielectric substrate on which the semiconductor light modulation device is mounted is joined to the temperature control module. This eliminates the need of the second dielectric substrate, so that it is possible to reduce cost. Further, the dielectric substrate can be made larger, so that a degree of freedom of mounting on the dielectric substrate is improved. Further, a signal line provided on the principal surface of the dielectric substrate can be connected to the lead pin with a short conductive wire, so that high-frequency characteristics are improved. Still further, a distance from the temperature control module to the semiconductor light modulation device is short, and thus, thermal diffusivity is improved, so that it is possible to improve heat absorption and dissipation at the temperature control module and reduce power consumption. Further, an electrical signal is input to the semiconductor light modulation device using a differential drive scheme, so that it is possible to reduce a voltage amplitude of the signal generator compared to a single-layer drive scheme in related art and reduce power consumption of the signal generator.

DESCRIPTION OF EMBODIMENTS

A semiconductor laser light source device according to the embodiments of the present disclosure will be described with reference to the drawings. The same components will be denoted by the same symbols, and the repeated description thereof may be omitted.

First Embodiment

Figure 1:
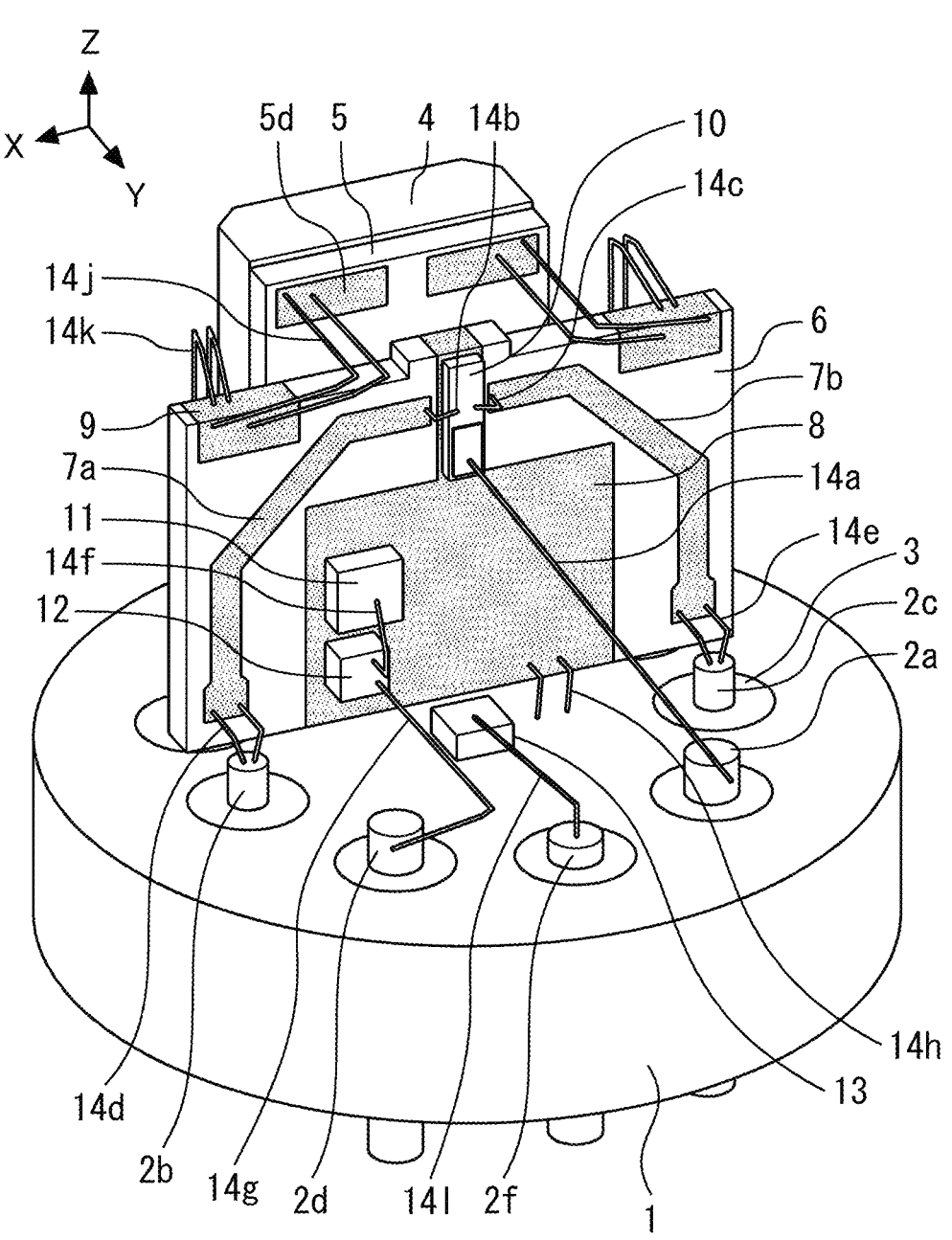
FIG. 1 is a front perspective view illustrating a semiconductor laser light source device according to a first embodiment.
Figure 2:
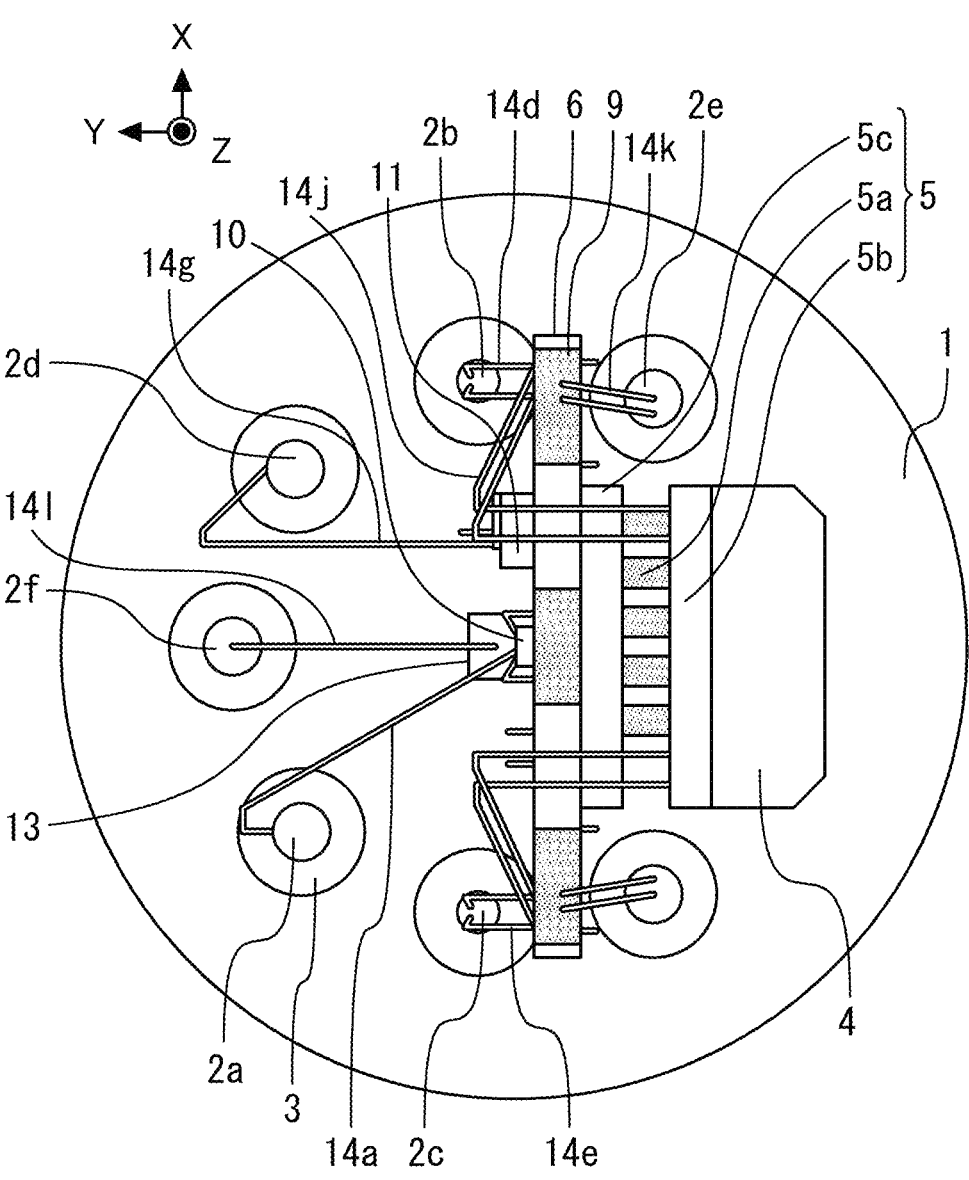
FIG. 2 is a top view illustrating the semiconductor laser light source according to the first embodiment.
Figure 3:
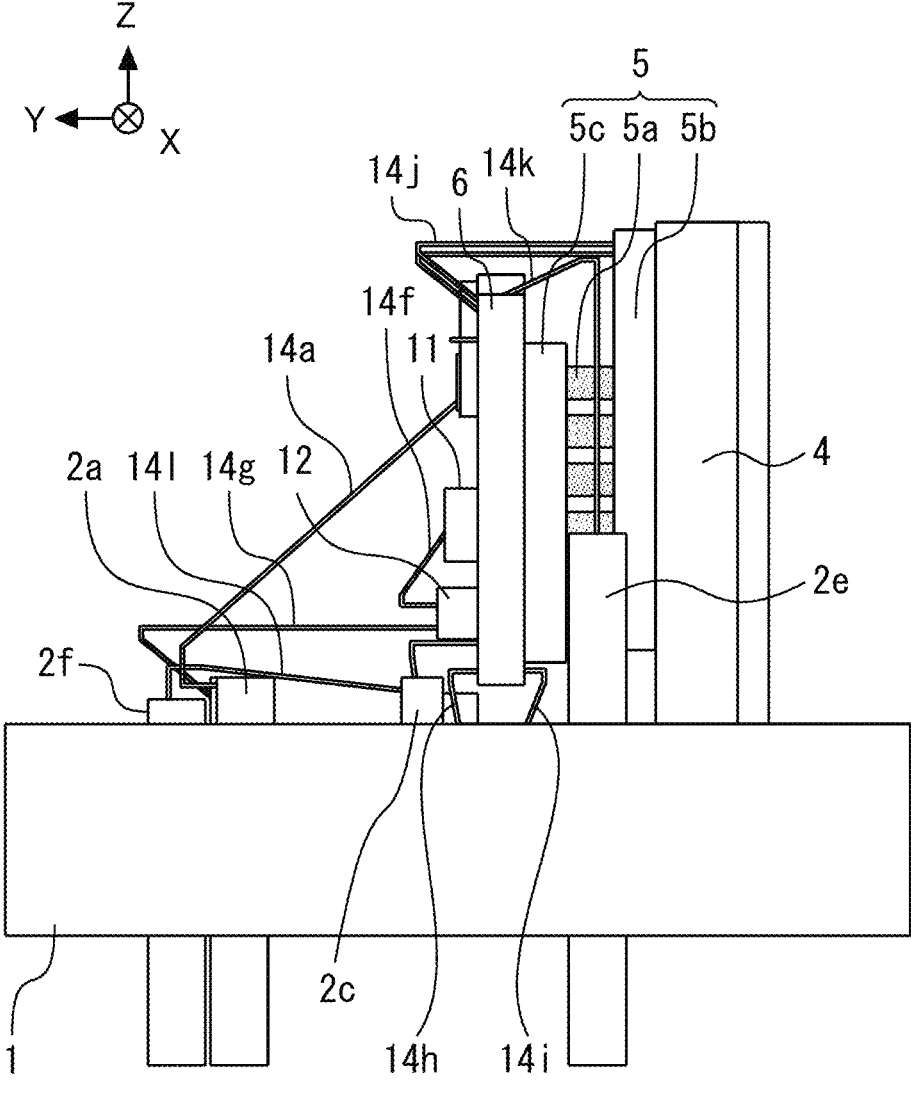
FIG. 3 is a side view illustrating the semiconductor laser light source device according to the first embodiment.
Figure 4:
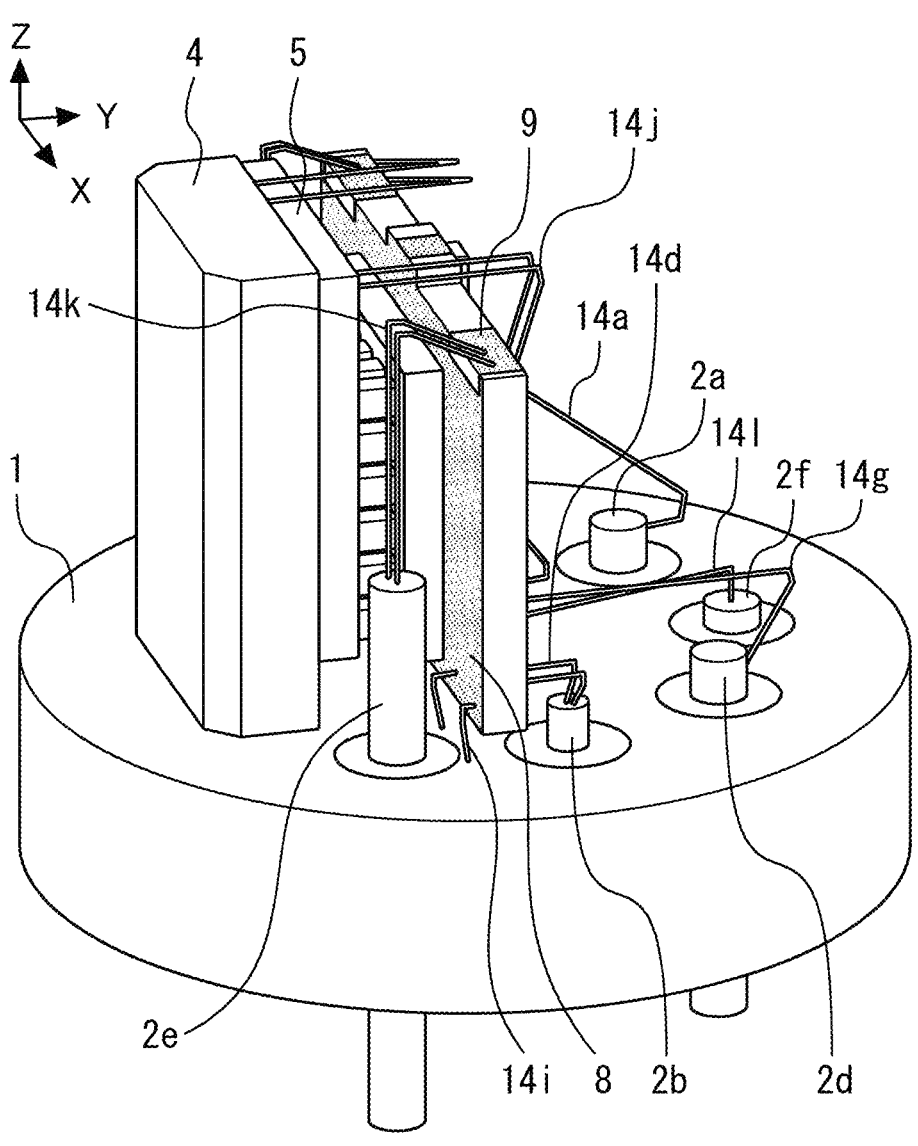
FIG. 4 is a rear perspective view illustrating the semiconductor laser light source device according to the first embodiment.

FIG. 1 is a front perspective view illustrating a semiconductor laser light source device according to a first embodiment. FIG. 2 is a top view illustrating the semiconductor laser light source according to the first embodiment. FIG. 3 is a side view illustrating the semiconductor laser light source device according to the first embodiment. FIG. 4 is a rear perspective view illustrating the semiconductor laser light source device according to the first embodiment.

A metal stem 1 is a stem base formed with a metal material and having a substantially circular plate shape, the stem base being obtained by applying Au plating, or the like, to a surface of a material with high thermal conductivity such as, for example, Cu. A plurality of lead pins 2a to 2f penetrate through the metal stem 1. Glass 3 is typically used to fix the lead pins 2a to 2f to the metal stem 1. If impedance mismatch occurs, frequency response characteristics deteriorate due to signal multiple reflection, and it is difficult to perform high-speed modulation. Thus, the glass 3 is formed with a material with low permittivity so as to achieve the same impedance as impedance of a signal generator.

A support block 4 is provided on the metal stem 1. The support block 4 is a block formed with a metal material, obtained by applying Au plating, or the like, to a surface of a material with high thermal conductivity such as, for example, Cu. The support block 4 may be mounted on the metal stem 1 as a part different from the metal stem 1, or the metal stem 1 and the support block 4 may be integrally formed.

A temperature control module 5 is mounted on a side surface of the support block 4. The temperature control module 5 is constituted by putting a plurality of thermoelectric devices 5a formed with a material such as, for example, BiTe between a lower substrate 5b and an upper substrate 5c formed with a material such as AlN. The side surface of the support block 4 is joined to the lower substrate 5b of the temperature control module 5 with a joining material such as, for example, SnAgCu solder and AuSn solder. The lower substrate 5b has a protruding portion protruding above the upper substrate 5c, and a metalized portion 5d for supplying power to the thermoelectric devices 5a is provided at the protruding portion.

A dielectric substrate 6 is formed in a rectangular plate shape, formed with a ceramic material such as, for example, aluminum nitride (AlN), and has an electrical insulating function and a heat transfer function. The dielectric substrate 6 has a principal surface and a back surface opposite to each other, and four side surfaces. A lower side surface among the four side surfaces of the dielectric substrate 6 faces an upper surface of the metal stem 1, and an upper side surface is located on the opposite side of the lower side surface. The back surface of the dielectric substrate 6 is joined to the upper substrate 5c of the temperature control module 5. Two differential driving signal lines 7a and 7b, a ground conductor 8 and a temperature control module conductor 9 are provided on the principal surface of the dielectric substrate 6 through Au plating and metalization. The differential driving signal lines 7a and 7b are a microstrip line and a coplanar line and have impedance equivalent to output impedance of a signal generator. The temperature control module conductor 9 is provided from the principal surface to the upper side surface of the dielectric substrate 6.

A semiconductor light modulation device 10, a temperature sensor 11 and a ceramic block 12 are mounted on the principal surface of the dielectric substrate 6. As a joining material for joining the temperature sensor 11 and the ceramic block 12 to the dielectric substrate 6, for example, SnAgCu solder, AuSn solder, or the like, is used. A modulator portion of the semiconductor light modulation device 10 includes a plurality of electro-absorption optical modulators. The temperature sensor 11 is, for example, a thermistor. The ceramic block 12 is, for example, an AlN substrate, and a conductor film is provided on an upper surface. A light receiving device 13 is mounted on the metal stem 1 or a sub-mount. Here, the light receiving device 13 is positioned on a negative direction side on a Z axis of the semiconductor light modulation device 10.

A conductive wire 14a connects a distributed-feedback laser diode of the semiconductor light modulation device 10 and the lead pin 2a. Conductive wires 14b and 14c respectively connect one ends of the two differential driving signal lines 7a and 7b and an electro-absorption modulator (EAM) electrode of the semiconductor light modulation device 10. Conductive wires 14d and 14e respectively connect the other ends of the two differential driving signal lines 7a and 7b and the lead pins 2b and 2c. A conductive wire 14f connects the temperature sensor 11 and the conductor film of the ceramic block 12. A conductive wire 14g connects the conductor film of the ceramic block 12 and the lead pin 2d. Conductive wires 14h and 14i connect the ground conductor 8 and the metal stem 1. A conductive wire 14j connects the temperature control module conductor 9 provided on the principal surface of the dielectric substrate 6 and the metalized portion 5d of the temperature control module 5. A conductive wire 14k connects the temperature control module conductor 9 provided on the upper side surface of the dielectric substrate 6 and the lead pin 2e. A conductive wire 14l connects the light receiving device 13 and the lead pin 2f.

The semiconductor light modulation device 10 is, for example, a modulator integrated-type laser diode (EAM-LD) obtained by monolithically integrating an electro-absorption optical modulator using an InGaAsP quantum-well absorption layer and a distributed-feedback laser diode. Laser light is emitted from a light emission point of the semiconductor light modulation device 10 along an optical axis perpendicular to a chip end surface and parallel to a chip principal surface. As a method for feeding power to the distributed-feedback laser diode, the distributed-feedback laser diode may be directly connected from the lead pin 2a via the conductive wire 14a or may be connected by way of a conductor provided on the dielectric substrate 6 depending on manufacturing methods.

Differential electrical signals input to the lead pins 2b and 2c are transmitted to the differential driving signal lines 7a and 7b via the conductive wires 14d and 14e and applied to the modulator of the semiconductor light modulation device 10 via the conductive wires 14b and 14c. Here, the electrical signals input to the lead pins 2b and 2c are electromagnetically coupled to the metal stem 1. The ground conductor 8 of the dielectric substrate 6 joined to the metal stem 1, the support block 4 and the temperature control module 5 acts as an AC ground.

If a temperature of the semiconductor light modulation device 10 changes, an oscillation wavelength changes, and thus, it is necessary to keep the temperature constant. Thus, in a case where the temperature of the semiconductor light modulation device 10 rises, the temperature control module 5 performs cooling, and, inversely, in a case where the temperature decreases, the temperature control module 5 generates heat to keep the temperature of the semiconductor light modulation device 10 constant. The heat generated at the semiconductor light modulation device 10 is transferred to the upper substrate 5c of the temperature control module 5 via the dielectric substrate 6. The temperature control module 5 absorbs heat received from the semiconductor light modulation device 10. The heat absorbed by the temperature control module 5 is propagated in a negative direction on the Z axis from the lower substrate 5b of the temperature control module 5 via the support block 4 and the metal stem 1 and dissipated to a cooling member (not illustrated) on the lower surface side of the metal stem 1.

The temperature sensor 11 indirectly measures the temperature of the semiconductor light modulation device 10. The measured temperature is fed back to the temperature control module 5, and the temperature control module 5 performs cooling in a case where the temperature of the semiconductor light modulation device 10 is high with respect to a target value, and generates heat in a case where the temperature is low. As a result of this, the temperature of the semiconductor light modulation device 10 can be stabilized.

If the temperature sensor 11 is directly wire-connected to the lead pin 2d, an ambient temperature transferred from an external world to the metal stem 1 flows into the temperature sensor 11, and an accurate temperature cannot be measured. Thus, the ceramic block 12 is positioned between the temperature sensor 11 and the lead pin 2d to perform relay. This can reduce an amount of heat flowing into the temperature sensor 11, so that the temperature sensor 11 can measure an accurate temperature. Further, the temperature sensor 11 and the semiconductor light modulation device 10 are mounted on the principal surface of the same dielectric substrate 6, so that temperature correlation can be easily achieved, which makes temperature control easy.

The light receiving device 13 converts (performs O/E conversion from) an optical signal into an electrical signal. The electrical signal is transmitted to the lead pin 2f via the connected conductive wire 14l. While the number of lead pins that penetrate through the metal stem 1 increases by one as a result of the light receiving device 13 being provided, intensity of backlight of the semiconductor light modulation device 10 can be monitored. By feeding back the monitoring result, it is possible to control a drive current of the semiconductor light modulation device 10 so as to make light output constant.

The semiconductor light modulation device 10, the temperature sensor 11 and the ceramic block 12 may be joined in advance on the dielectric substrate 6 to be assembled as a semifinished product, and the semifinished product may be joined to the temperature control module 5. This eliminates the need to necessarily use a material with a high melting point such as SnAgCu solder and AuSn solder as a joining material of the temperature control module 5 and the dielectric substrate 6, and a thermosetting resin, an ultraviolet-curing resin, or the like, can be used. This results in decreasing a level of manufacturing difficulty.

Figure 5:
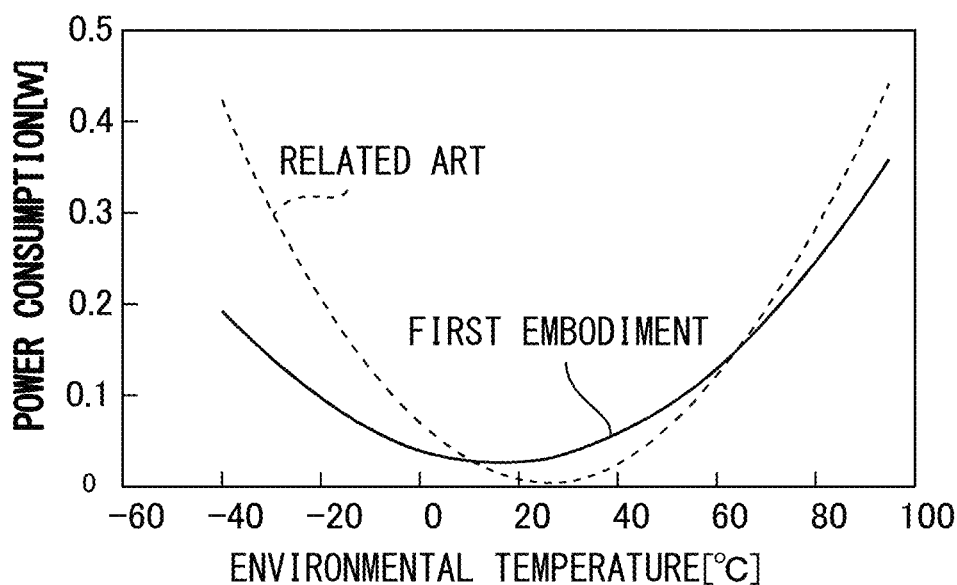
FIG. 5 is a graph comparing power consumption of a temperature control module between a structure in related art and a structure of the present embodiment.

FIG. 5 is a graph comparing power consumption of a temperature control module between a structure in related art and a structure of the present embodiment. A heat generation amount of the semiconductor light modulation device 10 was fixed at 0.2 W, and an environmental temperature was changed from −40° C. to 95° C. It can be seen that power consumption is lower at approximately 0.2 W in the structure of the present embodiment.

As described above, in the embodiment, the temperature control module 5 is mounted on the side surface of the support block 4 provided on the metal stem 1, and the dielectric substrate 6 on which the semiconductor light modulation device 10 is mounted is joined to the temperature control module 5. This eliminates the need of the second dielectric substrate, so that it is possible to reduce cost. Further, the dielectric substrate 6 can be made larger, so that a degree of freedom of mounting on the dielectric substrate 6 is improved. Further, a signal line provided on the principal surface of the dielectric substrate 6 can be connected to the lead pin with a short conductive wire, so that high-frequency characteristics are improved. Still further, a distance from the temperature control module 5 to the semiconductor light modulation device 10 is short, and thus, thermal diffusivity is improved, so that it is possible to improve heat absorption and dissipation at the temperature control module 5 and reduce power consumption. Further, an electrical signal is input to the semiconductor light modulation device 10 using a differential drive scheme, so that it is possible to reduce a voltage amplitude of the signal generator compared to a single-layer drive scheme in related art and reduce power consumption of the signal generator.

While in the structure in related art, the second dielectric substrate is interposed, and thus, a signal is reflected due to impedance mismatch at a connection point, which decreases a gain of a band, in the present embodiment, the second dielectric substrate is not required, and thus, a signal reflection point does not exist, so that it is possible to achieve a wider bandwidth than in the structure in related art.

The temperature control module 5 is directly joined to the dielectric substrate 6 without a secondary medium such as a metal block existing therebetween. Thus, a distance between the semiconductor light modulation device 10 and the temperature control module 5 corresponds to only a thickness of the dielectric substrate 6. Thus, a thermal distance from the temperature control module 5 to the semiconductor light modulation device 10 is short, and thus, heat dissipation is improved, so that power consumption can be reduced. Further, the temperature control module 5 is directly joined to the dielectric substrate 6, so that it is possible to reduce cost as a result of reduction in manufacturing processes, a period, and the number of members.

Further, the differential driving signal lines 7a and 7b on the dielectric substrate 6 are directly connected to the lead pins 2b and 2c only with the conductive wires 14d and 14e without intervention of other dielectric substrates. This reduces signal reflection points, which leads to improvement in high-frequency characteristics.

To seal and fix the lead pins 2a to 2f to the metal stem 1 with the glass 3, typically, a compression scheme or a matching scheme is applied. It is important that each of the lead pins 2a to 2f has an equal pressure upon sealing to keep airtightness. It is therefore desirable that the lead pins 2a to 2f are arranged in a circular shape with respect to the metal stem 1. Further, if an interval between adjacent lead pins 2a to 2f is too close, sealing properties deteriorate, and thus, a certain degree of distance is required.

In the structure in related art in which the temperature control module is flatly placed and joined to the metal stem 1, an area on the metal stem 1 is occupied, which makes it impossible to equally arrange the lead pins 2a to 2f and achieve airtightness. In the present embodiment, the temperature control module 5 is joined to the side surface of the support block 4, so that an occupied area on the metal stem 1 can be reduced.

Further, while the lead pins 2a to 2d are arranged on the principal surface side of the dielectric substrate 6, two lead pins 2e for feeding power to the temperature control module 5 are arranged on the back surface side of the dielectric substrate 6. This enables the lead pins 2a to 2f to be equally arranged in a circular shape with respect to the metal stem 1. This results in improving airtightness. Further, the conductive wire 14j connects the metalized portion 5d of the temperature control module 5 and the temperature control module conductor 9, and the conductive wire 14k connects the temperature control module conductor 9 and the lead pin 2e. This makes a distance from the lead pin 2e to the metalized portion 5d on an XY plane short. Thus, influence of moment load to be applied on the conductive wires 14j and 14k becomes small, so that resistance to flexure, vibration and impact of the conductive wires 14j and 14k is improved.

If a lead pin positioned on the principal surface side of the dielectric substrate 6, other than the lead pins 2b and 2c connected to the differential driving signal lines 7a and 7b, is wire-connected to the metalized portion 5d, a distance from the lead pin to the metalized portion 5d on the XY plane becomes long. This causes a problem that flexure occurs in the conductive wire by influence of the moment load, and the conductive wire comes into contact with the dielectric substrate 6. Further, there is also a problem that the conductive wire drops off from the lead pin by influence of vibration and impact during transportation, or the like. Further, it is difficult to directly connect the conductive wire from the lead pin positioned on the principal surface side of the dielectric substrate 6 to the metalized portion 5d of the temperature control module 5. Thus, in the present embodiment, the temperature control module conductor 9 is provided from the principal surface to the upper side surface of the dielectric substrate 6. The conductive wire 14j connects the metalized portion 5d of the temperature control module 5 and the temperature control module conductor 9, and the conductive wire 14k connects the temperature control module conductor 9 and the lead pin 2e positioned on the back surface of the dielectric substrate 6. This makes it possible to supply power to the temperature control module 5 without using a complicated mechanism of a wire bonding device.

An emission position and an emission angle of the semiconductor light modulation device 10 are displaced due to change in thermal stress of a member in association with change in the ambient temperature. This reduces optical coupling efficiency when the laser light source device collects laser light to an optical fiber. It is therefore important to employ a structure that is less likely to be affected by change in thermal stress. In the present embodiment, an outer diameter of the dielectric substrate 6 in an X axis direction and a Z axis direction is larger than an outer diameter of the upper substrate 5c of the temperature control module 5 in the X axis direction and the Z axis direction. This improves stiffness of the structure, can reduce stress to the semiconductor light modulation device 10 and can prevent breaking, or the like, of the semiconductor light modulation device 10. Further, the dielectric substrate 6 can prevent influence of a flexure amount of the temperature control module 5. This results in reducing displacement of an emission position and an emission angle in a positive direction on the Y axis compared to a case where the outer diameter of the dielectric substrate 6 is smaller than the outer diameter of the upper substrate 5c. Note that the outer diameter of the upper substrate 5c of the temperature control module 5 may be made larger than the outer diameter of the dielectric substrate 6. This improves heat dissipation and improves heat absorption and dissipation at the temperature control module 5, so that it is possible to reduce power consumption.

In the structure in related art, a ground of the semiconductor light modulation device passes from the first dielectric substrate to the second dielectric substrate with the conductive wire and is connected to the metal stem via the metal block that supports the second dielectric substrate. Thus, a distance is long, and a GND becomes weak, which leads to deterioration of high-frequency characteristics. In contrast, in the present embodiment, the ground conductor 8 of the dielectric substrate 6 is directly connected to the metal stem 1 only with the conductive wires 14h and 14i without intervention of the second dielectric substrate. By this means, the GND becomes strong, and high-frequency characteristics are improved.

The ground conductor 8 is provided from the principal surface to the back surface of the dielectric substrate 6 in a region not in contact with the differential driving signal lines 7a and 7b and the temperature control module conductor 9. To achieve a ground common among the semiconductor light modulation device 10, the temperature sensor 11, and the like, the conductive wire 14h connects the ground conductor 8 on the principal surface of the dielectric substrate 6 and the metal stem 1. However, it is difficult to achieve an equal potential only by this, and it is known from a high-frequency simulation that it is difficult to achieve a wider bandwidth of frequency response characteristics. Thus, the conductive wire 14i connects the ground conductor 8 on the back surface of the dielectric substrate 6 and the metal stem 1. As a result of this, the frequency response characteristics are improved. The conductive wires 14h and 14i exert a little improvement effect with one wire, and thus, it is desirable that two or more wires are provided.

Note that if the dielectric substrate 6 is in contact with the metal stem 1, heat transferred from outside to the metal stem 1 flows into the semiconductor light modulation device 10 and the temperature sensor 11 via the dielectric substrate 6. This makes it difficult for the temperature control module 5 to perform temperature control. It is therefore desirable to prevent the dielectric substrate 6 and the metal stem 1 from coming contact with each other.

Further, the lead pins 2b and 2c connected to the differential driving signal lines 7a and 7b have an inner lead portion protruding from an upper surface of the metal stem 1. As a length of the inner lead portion is made shorter, inductance component is reduced, a loss due to reflection of a signal at the inner lead portion can be reduced, and a passband is improved.

Further, to obtain a maximum voltage amplitude from the signal generator, a matching resistor may be provided on the principal surface of the dielectric substrate 6 so as to be connected in parallel to the semiconductor light modulation device 10.

Second Embodiment

Figure 6:
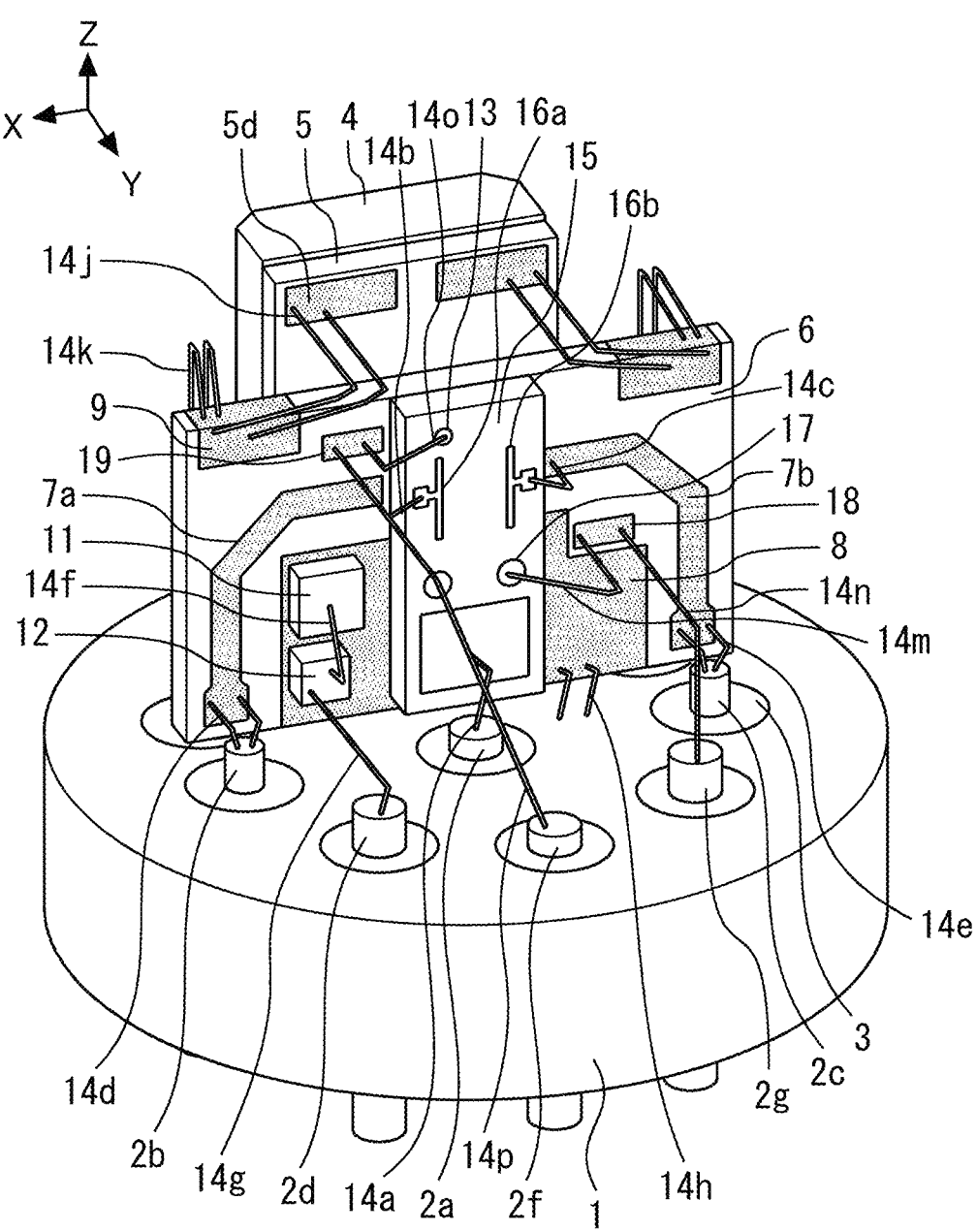
FIG. 6 is a front perspective view illustrating a semiconductor laser light source device according to a second embodiment.

FIG. 6 is a front perspective view illustrating a semiconductor laser light source device according to a second embodiment. In place of the semiconductor light modulation device 10, a Mach Zehnder module (MZM) type semiconductor light modulation device 15 is mounted on the principal surface of the dielectric substrate 6. The semiconductor light modulation device 15 is a laser diode in which, for example, a distributed-feedback laser diode, two phase modulator portions 16a and 16b, a polarization rotator portion 17 and the light receiving device 13 are monolithically integrated. The phase modulator portions 16a and 16b are Mach Zehnder optical modulators.

In a similar manner to the first embodiment, the differential driving signal lines 7a and 7b, and the like, are provided on the principal surface of the dielectric substrate 6, and further, a polarization rotator conductor 18 and a light receiving device conductor 19 are provided on the principal surface of the dielectric substrate 6 through Au plating and metalization. The conductive wires 14b and 14c connect one ends of the two differential driving signal lines 7a and 7b and the phase modulator portions 16a and 16b of the semiconductor light modulation device 15. A conductive wire 14m connects the polarization rotator portion 17 of the semiconductor light modulation device 15 and the polarization rotator conductor 18. A conductive wire 14n connects the polarization rotator conductor 18 and the lead pin 2g. A conductive wire 14o connects the light receiving device 13 of the semiconductor light modulation device 15 and the light receiving device conductor 19. A conductive wire 14p connects the light receiving device conductor 19 and the lead pin 2f.

The semiconductor light modulation device 15 includes two phase modulator portions 16a and 16b and one polarization rotator portion 17, and thus, in ordinary circumstances, it is necessary to provide one more lead pin than in the first embodiment. However, if one lead pin is added to the structure in the first embodiment and the lead pins are arranged in a circular shape, an interval between the lead pins becomes too narrow, and there is a case where airtightness cannot be secured, and mass productivity cannot be secured.

Thus, in the present embodiment, the lead pin 2a is positioned at a central portion of the metal stem 1. A pressure is likely to be equally applied to the central portion, so that it is possible to keep airtightness equivalent to that in the first embodiment. Note that in the structure in related art in which the temperature control module is flatly placed and joined to the central portion of the metal stem, the lead pin cannot be positioned at the central portion of the metal stem, and airtightness deteriorates.

A vertical and horizontal outer diameter of the MZM type semiconductor light modulation device 15 is several mm, which is several times of the outer diameter of the electroabsorption optical modulator in the first embodiment. Thus, in the structure in related art in which the second dielectric substrate exists on the stem, it is difficult to mount the MZM type semiconductor light modulation device 15. To mount the MZM type semiconductor light modulation device, it is necessary to expand the structure by several mm in a light emission direction, which increases an outer diameter of the laser light source device. In association with this, a distance from the temperature control module 5 to the semiconductor light modulation device 15 becomes long, heat absorption and dissipation by the temperature control module 5 deteriorate, and the temperature control module 5 is required to achieve higher performance. Further, a distance from the lead pin to the semiconductor light modulation device also becomes long, and thus, high-frequency characteristics deteriorate due to extension of a high-frequency line.

In contrast, in the present embodiment, the degree of freedom of mounting on the dielectric substrate 6 is improved compared to the related art, so that it is possible to mount the MZM type semiconductor light modulation device 15 on the principal surface of the dielectric substrate 6 without increasing the outer diameter of the laser light source device. A distance from the temperature control module 5 to the semiconductor light modulation device 15 corresponds to a thickness of the dielectric substrate 6, which is extremely short, and thus, heat absorption and dissipation is favorable in a similar manner to the first embodiment, and the temperature control module 5 is not required to achieve higher performance. Further, the high-frequency line does not have to be extended, and high-frequency characteristics do not deteriorate.

Note that while the light receiving device 13 is typically integrated on the MZM type semiconductor light modulation device 15, the light receiving device 13 may be separately mounted in a similar manner to the first embodiment. Other configurations and effects are similar to those in the first embodiment.

Third Embodiment

Figure 7:
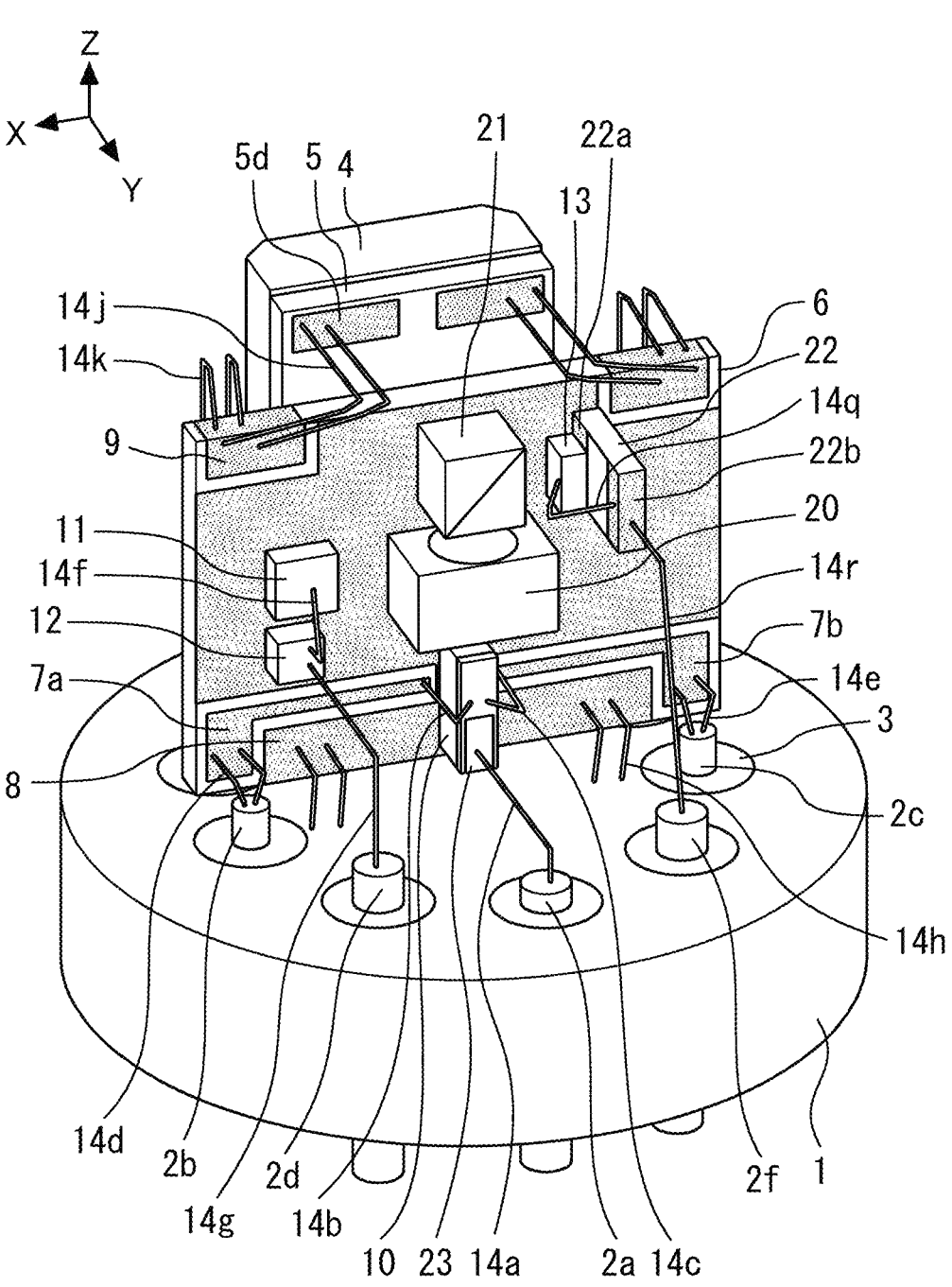
FIG. 7 is a front perspective view illustrating the semiconductor laser light source device according to a third embodiment.

FIG. 7 is a front perspective view illustrating the semiconductor laser light source device according to a third embodiment. A lens 20, an optical device 21 and a block 22 are mounted on the principal surface of the dielectric substrate 6. The light receiving device 13 is mounted on a side surface of the block 22. In place of the semiconductor light modulation device 10, a semiconductor light modulation device 23 is mounted on the principal surface of the dielectric substrate 6.

The semiconductor light modulation device 23 includes a semiconductor optical amplifier (SOA) that amplifies intensity of laser light. It is therefore possible to obtain higher light output. An entire length of the semiconductor light modulation device 23 including the optical amplifier becomes longer, but in the present embodiment, a mounting space of the principal surface of the dielectric substrate 6 is large, and thus, it is not necessary to change a structure of the dielectric substrate 6 that becomes a factor of high cost or band deterioration.

The lens 20 and the optical device 21 are formed with glass such as, for example, $SiO_2$. The lens 20 and the optical device 21 are joined to the dielectric substrate 6 using a joining material such as an adhesive of an epoxy resin. In a case where an epoxy resin is used, joining is performed by, after temporary curing through ultraviolet irradiation immediately after bonding, thermal curing through a thermal treatment process.

The lens 20 collimates and collects laser light emitted from the semiconductor light modulation device 23 in a positive direction on the Z axis. The optical device 21 separates part of the laser light emitted from the semiconductor light modulation device 23. The light receiving device 13 converts the separated laser light into an electrical signal.

In the structure in related art, the second dielectric substrate is used, and thus, it is difficult to mount the light receiving device 13. If the lens 20, the optical device 21 and the light receiving device 13 are mounted, the structure becomes complicated, the outer diameter of the laser light source device becomes larger, and strength and reliability in terms of heat distribution deteriorate. In contrast, in the present embodiment, the degree of freedom in mounting on the dielectric substrate 6 is improved compared to the related art, so that it is possible to mount the lens 20, the optical device 21, the block 22, the light receiving device 13, and the like, on the principal surface of the dielectric substrate 6 without increasing the outer diameter of the laser light source device.

The block 22 is, for example, an MN substrate, and conductors 22a and 22b that are separated from each other are provided on its surface. A back electrode of the light receiving device 13 is joined to the conductor 22a of the block 22 through soldering, or the like. A surface electrode of the light receiving device 13 is joined to the conductor 22b with a conductive wire 14q. These joined parts are assembled in a process other than an assembly process as a semifinished product, and this semifinished product is joined to the principal surface of the dielectric substrate 6 at the same time as joining of the semiconductor light modulation device 23, and the like. By this means, a level of manufacturing difficulty decreases compared to a case where a semifinished product is not manufactured. After the semifinished product is joined to the principal surface of the dielectric substrate 6, the conductor 22b is connected to the lead pin 2f with a conductive wire 14r. By this means, an electrical signal that is OE converted at the light receiving device 13 can be transmitted on a negative direction side on the Z axis of the lead pin 2f. Other configurations and effects are similar to those in the first embodiment.

Fourth Embodiment

Figure 8:
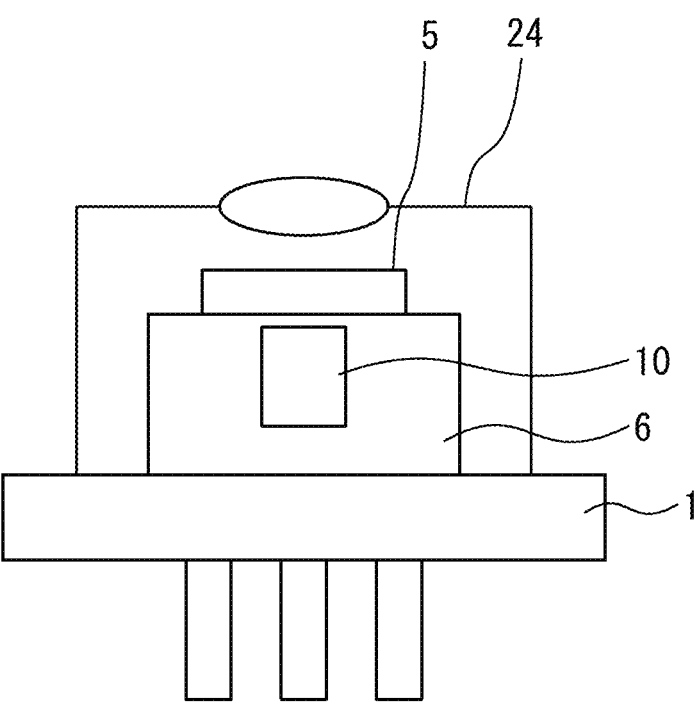
FIG. 8 is a schematic view illustrating a semiconductor laser light source device according to a fourth embodiment.

FIG. 8 is a schematic view illustrating a semiconductor laser light source device according to a fourth embodiment. A cap 24 with a lens is joined to the metal stem 1 in the semiconductor laser light source device in any one of the first to the third embodiments. The cap 24 with a lens is a cap for hermetic seal that airtightly seals the support block 4, the temperature control module 5, the dielectric substrate 6, the semiconductor light modulation device 10, the temperature sensor 11, and the like, mounted on the metal stem 1. It is therefore possible to improve moisture resistance and disturbance tolerance. The lens of the cap 24 with a lens is formed with glass including, for example, $SiO_2$ and substantially collects or collimates the laser light emitted from the semiconductor light modulation device 10. For example, in a case where the cap 24 with a lens is joined in the third embodiment, after the laser light of the semiconductor light modulation device 23 with a large spread angle is collimated at the lens 20, the collimated light is collected with the cap 24 with a lens and made incident on a fiber. Note that in the first and the second embodiments, the laser light is directly collected and made incident on the fiber without being collimated.

REFERENCE SIGNS LIST

1 metal stem; 2a-2g lead pin; 4 support block; 5 temperature control module; 5a thermoelectric device; 5b lower substrate; 5c upper substrate; 5d metalized portion; 6 dielectric substrate; 7a, 7b differential driving signal line; 8 ground conductor; 10,15,23 semiconductor light modulation device; 11 temperature sensor; 12 ceramic block; 13 light receiving device; 14a-14r conductive wire; 21 optical device; 22 block; 20 lens; 24 cap with a lens

The invention claimed is:

1. A semiconductor laser light source device comprising:
a metal stem;
first to third lead pins penetrating through the metal stem;
a support block provided on the metal stem;
a temperature control module mounted on a side surface of the support block and including a lower substrate, an upper substrate, and a plurality of thermoelectric devices put between the lower substrate and the upper substrate;
a dielectric substrate having a back surface joined to the upper substrate of the temperature control module;
two differential driving signal lines provided on a principal surface of the dielectric substrate;
a semiconductor light modulation device mounted on the principal surface of the dielectric substrate;
a temperature sensor mounted on the principal surface of the dielectric substrate;
a first conductive wire connecting one end of one of the differential driving signal lines and the semiconductor light modulation device;
a second conductive wire connecting the other end of the differential driving signal line and the first lead pin;
a third conductive wire connecting the temperature sensor and the second lead pin; and
a fourth conductive wire connecting the temperature control module and the third lead pin,
wherein the first and second lead pins are arranged on the principal surface side of the dielectric substrate, and
the third lead pin is arranged on a back surface side of the dielectric substrate,
the lower substrate has a protruding portion protruding above the upper substrate,
a metalized portion for supplying power to the thermoelectric devices is provided at the protruding portion,
a temperature control module conductor is provided from the principal surface to an upper side surface of the dielectric substrate, and
the fourth conductive wire includes a conductive wire connecting the temperature control module conductor provided on the upper side surface of the dielectric substrate and the third lead pin, and a conductive wire connecting the temperature control module conductor provided on the principal surface of the dielectric substrate and the metalized portion.

2. The semiconductor laser light source device according to claim 1, wherein the other end of the differential driving signal line is directly connected to the first lead pin with the second conductive wire.

3. The semiconductor laser light source device according to claim 1, wherein an outer diameter of the dielectric substrate is larger than an outer diameter of the upper substrate.

4. The semiconductor laser light source device according to claim 1, further comprising a ceramic block mounted on the dielectric substrate and having a conductor film,
wherein the third conductive wire includes a conductive wire connecting the conductor film and the temperature sensor, and a conductive wire connecting the conductor film and the second lead pin.

5. The semiconductor laser light source device according to claim 1, wherein a modulator portion of the semiconductor light modulation device includes a plurality of electro-absorption optical modulators.

6. The semiconductor laser light source device according to claim 1, wherein a phase modulator portion of the semiconductor light modulation device is a Mach Zehnder optical modulator.

7. The semiconductor laser light source device according to claim 1, comprising a lens mounted on the principal surface of the dielectric substrate and collecting or collimating laser light emitted from the semiconductor light modulation device.

8. The semiconductor laser light source device according to claim 1, further comprising a light receiving device converting part of laser light emitted from the semiconductor light modulation device into an electrical signal.

9. The semiconductor laser light source device according to claim 8, further comprising an optical device mounted on the principal surface of the dielectric substrate and separating part of laser light emitted from the semiconductor light modulation device, and a block mounted on the principal surface of the dielectric substrate, and wherein the light receiving device is mounted on a side surface of the block and converts the part of the laser light separated by the optical device into an electrical signal.

10. The semiconductor laser light source device according to claim 1, wherein the semiconductor light modulation device includes an optical amplifier that amplifies intensity of laser light.

11. The semiconductor laser light source device according to claim 1, wherein a cap for hermetic sealing is joined to the metal stem.

12. A semiconductor laser light source device comprising:

a metal stem;

first to third lead pins penetrating through the metal stem;

a support block provided on the metal stem;

a temperature control module mounted on a side surface of the support block and including a lower substrate, an upper substrate, and a plurality of thermoelectric devices put between the lower substrate and the upper substrate;

a dielectric substrate having a back surface joined to the upper substrate of the temperature control module;

two differential driving signal lines provided on a principal surface of the dielectric substrate;

a semiconductor light modulation device mounted on the principal surface of the dielectric substrate;

a temperature sensor mounted on the principal surface of the dielectric substrate;

a first conductive wire connecting one end of one of the differential driving signal lines and the semiconductor light modulation device;

a second conductive wire connecting the other end of the differential driving signal line and the first lead pin;

a third conductive wire connecting the temperature sensor and the second lead pin; and a fourth conductive wire connecting the temperature control module and the third lead pin, a ground conductor is provided on the dielectric substrate and directly connected to the metal stem with conductive wires, and a portion of the ground conductor is provided on the principal surface and another portion of the ground conductor is provided on a back surface of the dielectric substrate and each portion is connected to the metal stem with the conductive wires respectively.

13. The semiconductor laser light source device according to claim 12, wherein the other end of the differential driving signal line is directly connected to the first lead pin with the second conductive wire.

14. The semiconductor laser light source device according to claim 12, wherein an outer diameter of the dielectric substrate is larger than an outer diameter of the upper substrate.

15. The semiconductor laser light source device according to claim 12, further comprising a ceramic block mounted on the dielectric substrate and having a conductor film, wherein the third conductive wire includes a conductive wire connecting the conductor film and the temperature sensor, and a conductive wire connecting the conductor film and the second lead pin.

16. The semiconductor laser light source device according to claim 12, wherein a modulator portion of the semiconductor light modulation device includes a plurality of electro-absorption optical modulators.

17. The semiconductor laser light source device according to claim 12, wherein a phase modulator portion of the semiconductor light modulation device is a Mach Zehnder optical modulator.

18. The semiconductor laser light source device according to claim 12, comprising a lens mounted on the principal surface of the dielectric substrate and collecting or collimating laser light emitted from the semiconductor light modulation device.

19. The semiconductor laser light source device according to claim 12, further comprising a light receiving device converting part of laser light emitted from the semiconductor light modulation device into an electrical signal.

20. The semiconductor laser light source device according to claim 12, wherein the semiconductor light modulation device includes an optical amplifier that amplifies intensity of laser light.

* * * * *